(12) United States Patent
Kang

(10) Patent No.: US 6,867,998 B2
(45) Date of Patent: Mar. 15, 2005

(54) CELL ARRAY BLOCK OF FERAM, AND FERAM USING CELL ARRAY

(75) Inventor: Hee Bok Kang, Daejeon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/737,846

(22) Filed: Dec. 18, 2003

(65) Prior Publication Data

US 2005/0024916 A1 Feb. 3, 2005

(30) Foreign Application Priority Data

Jul. 30, 2003 (KR) ................................ 10-2003-0052661

(51) Int. Cl.⁷ .............................................. G11C 11/22
(52) U.S. Cl. ........................ 365/145; 365/63; 365/149
(58) Field of Search ........................... 365/63, 145, 149

(56) References Cited

U.S. PATENT DOCUMENTS 5,682,343 A * 10/1997 Tomishima et al. ........... 365/63
5,886,943 A * 3/1999 Sekiguchi et al. ............ 365/63
6,314,029 B1 * 11/2001 Ko et al. ..................... 365/190

FOREIGN PATENT DOCUMENTS

KR 1019980014400 7/2000

* cited by examiner

Primary Examiner—Son Mai
(74) Attorney, Agent, or Firm—Heller Ehrman White and McAuliffe LLP

(57) ABSTRACT

The present invention discloses a cell array block of a ferroelectric random access memory (FeRAM) and an FeRAM using the same. In the multi-bit line structure cell array block of the FeRAM having a sub bit line and a main bit line, and including a plurality of sub cell arrays for inducing a sensing voltage of the main bit line by converting a sensing voltage of the sub bit line into current, in order to overcome different data properties of the whole sub cell arrays due to delay time differences by positions of the sub cell arrays, a different size of sensing loads are selectively transmitted to the main bit line according to the positions of the operated sub cell arrays, or a different size of ferroelectric capacitors are used in a memory cell according to the positions of the sub cell arrays. As a result, the cell data properties of the whole cell array block are equalized for even distribution.

18 Claims, 16 Drawing Sheets

US 6,867,998 B2

CELL ARRAY BLOCK OF FERAM, AND FERAM USING CELL ARRAY

BACKGROUND OF THE INVENTION

1. Field of the Invention

The present invention relates to a ferroelectric random access memory (FeRAM), and more particularly to an FeRAM which can compensate for property variations according to positions of cell arrays, by setting different load conditions or changing a size of capacitors according to the positions of each cell array in a multi-bit line structure cell array block.

2. Description of the Background Art

In general, an FeRAM has a data processing speed equivalent to a dynamic random access memory (DRAM), and preserves data even when power is off.

The FeRAM is a memory having a similar structure to the DRAM. The FeRAM employs a ferroelectric substance to form a capacitor, and thus uses high remanent polarization which is a property of the ferroelectric substance. Even if electric fields are removed, data are not deleted in the FeRAM due to the remanent polarization.

The technical descriptions of the FeRAM have been disclosed in Korea Patent application No. 1998-14400 by the same inventors as the present invention. Therefore, detailed explanations of the basic structures and operation principles of the FeRAM are omitted.

In the FeRAM, when a number of cell array blocks increases, the cell array blocks have slightly different operation properties from each other due to physical limits. That is, write or read timing conditions are different in each cell depending on circuit delay time or other conditions.

As a result, as shown in FIG. 1, cell data sensing voltages are regularly shifted for target levels according to positions of cell arrays due to the design factors. Such a non-uniform phenomenon leads to deterioration of properties of cell data.

SUMMARY OF THE INVENTION

Accordingly, it is a primary object of the present invention to equalize properties of cell data of a whole cell array block, by setting loading conditions different according to positions of cell arrays in a ferroelectric random access memory having a multi-bit line structure.

Another object of the present invention is to equalize properties of cell data of a whole cell array block, by setting cell capacitor conditions different according to positions of cell arrays in a ferroelectric random access memory having a multi-bit line structure.

In an embodiment, a cell array block of a ferroelectric random access memory having a sub bit line and a main bit line comprises a cell array unit, a main bit line pull-up control unit, a main bit line sensing load unit and a column select switch unit. The cell array unit includes a plurality of sub cell arrays wherein a sensing voltage of the main bitline is induced depending on the amount of current leaked from the main bitline by a sensing voltage of the sub bitline. The main bit line pull-up control unit pulls up the main bit line in response to a main bit line pull-up control signal in a precharge mode. The main bit line sensing load unit selectively applies a different size of sensing loads to the main bit line in response to a main bit line load control signal, the size corresponding to a position of the sub cell array operated among the plurality of sub cell arrays. The column select switch unit selectively outputs the sensing voltage of the main bit line to a common data bus in response to a column select signal.

According to one aspect of the invention, a cell array block of a ferroelectric random access memory having a sub bit line and a main bit line comprises a cell array unit, a main bit line pull-up control unit, a main bit line sensing load unit and a column select switch unit. The cell array unit includes a plurality of sub cell arrays wherein a sensing voltage of the main bitline is induced depending on the amount of current leaked from the main bitline by a sensing voltage of the sub bitline according to a data value of a memory cell having ferroelectric capacitors. The main bit line pull-up control unit pulls up the main bit line in response to a main bit line pull-up control signal in a precharge mode. The main bit line sensing load unit applies a sensing load to the main bit line in response to a main bit line load control signal. The column select switch unit selectively outputs the sensing voltage of the main bit line to a common data bus in response to a column select signal, wherein the ferroelectric capacitors have a different size according to positions of the plurality of sub cell arrays.

According to another aspect of the invention, a ferroelectric random access memory having a sub bit line and a main bit line comprises a cell array unit, a main bit line pull-up control unit, a main bit line sensing load unit and a column select switch unit. The plurality of cell array blocks includes a plurality of sub cell arrays wherein a sensing voltage of the main bitline is induced depending on the amount of current leaked from the main bitline by a sensing voltage of the sub bitline. The common data bus shared by the plurality of cell array blocks transmits read data and write data for the cell array blocks. The timing data register array unit connected to the common data bus senses the read data and outputting the write data to the common data bus, wherein the plurality of cell array blocks apply a different size of sensing loads to the main bit line according to a position of the operated sub cell array.

According to yet another aspect of the invention, a ferroelectric random access memory having a sub bit line and a main bit line comprises a plurality of cell array blocks, a common data bus and a timing data register array unit. The plurality of cell array blocks include a plurality of sub cell arrays wherein a sensing voltage of the main bitline is induced depending on the amount of current leaked from the main bitline by a sensing voltage of the sub bitline. The common data bus shared by the plurality of cell array blocks transmits read data and write data for the cell array blocks. The timing data register array unit connected to the common data bus senses the read data and outputting the write data to the common data bus, wherein the plurality of sub cell arrays have a different size of ferroelectric capacitors in a memory cell for storing data according to their positions.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

Preferred embodiments of the present invention will now be described in detail with reference to the accompanying drawings.

Figure 1:
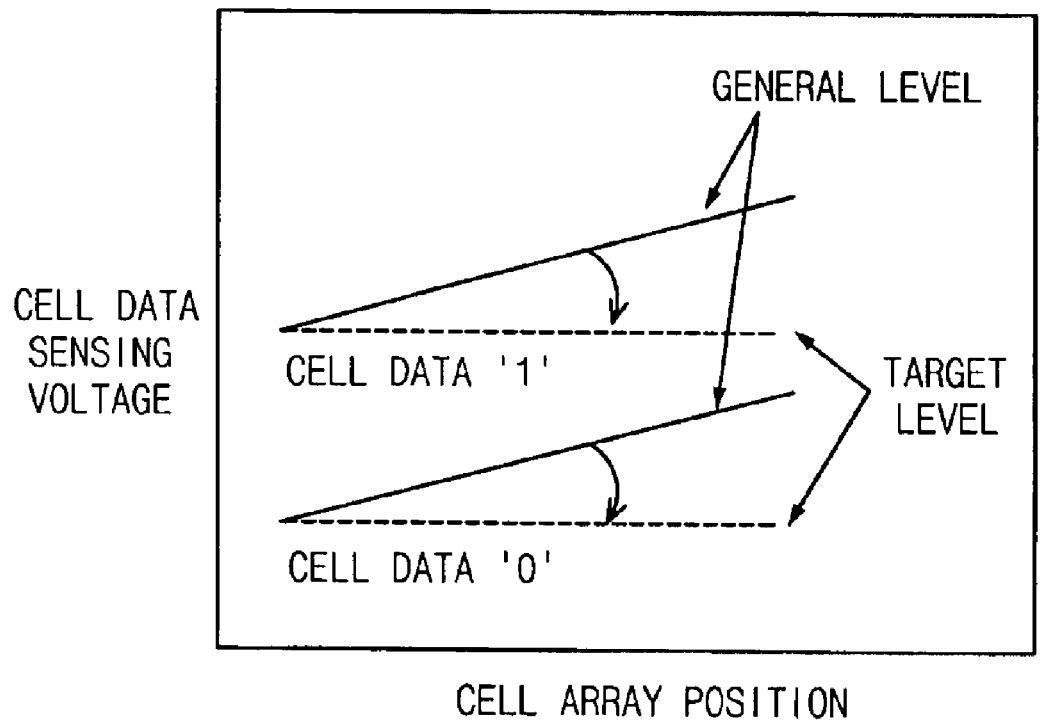
FIG. 1 is a diagram illustrating variations of sensing voltage properties of cell data according to positions of cell arrays.
Figure 2:
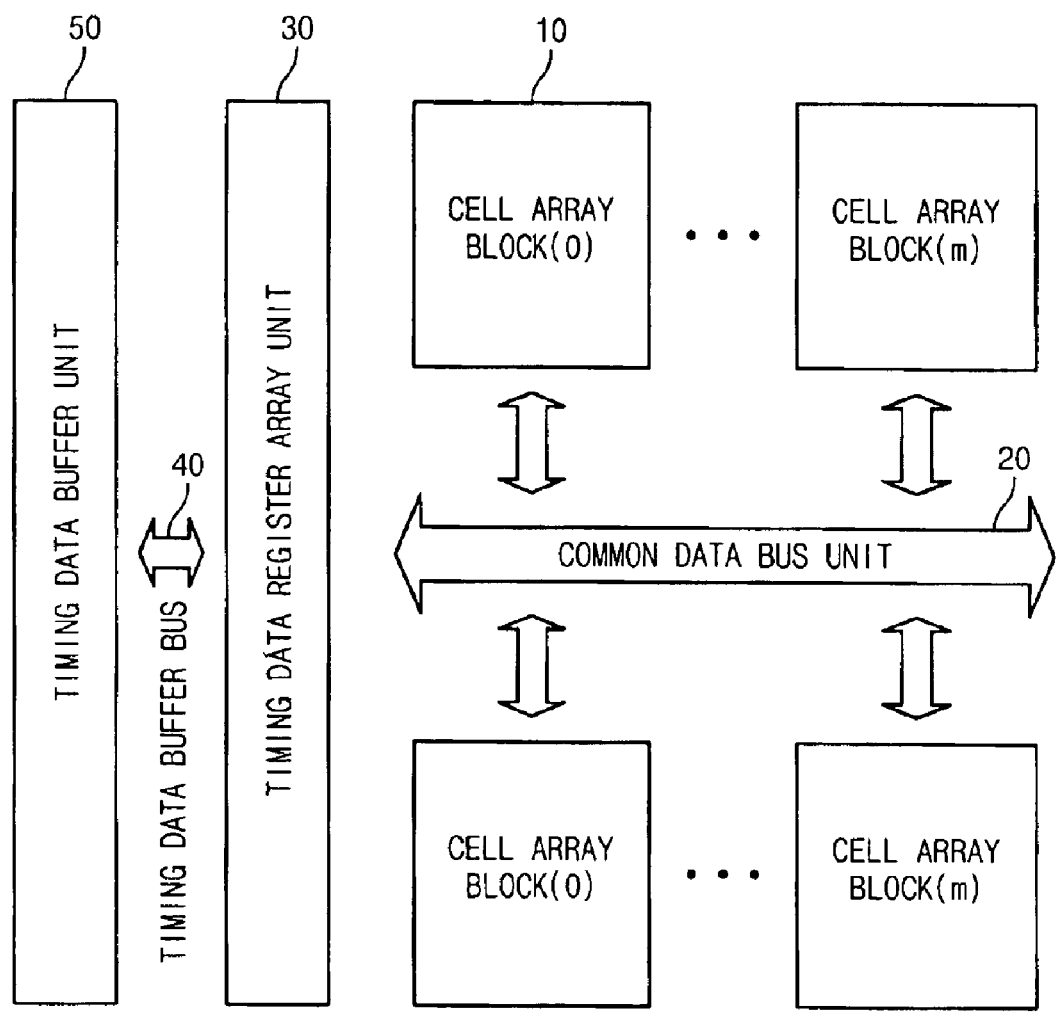
FIG. 2 is a structure diagram illustrating cell array blocks of an FeRAM in accordance with the present invention.

FIG. 2 is a structure diagram illustrating cell array blocks of an FeRAM in accordance with the present invention.

Referring to FIG. 2, the FeRAM includes a plurality of cell array blocks 10, a common data bus 20, a timing data register array unit 30, a timing data buffer bus 40 and a timing data buffer unit 50.

The cell array blocks 10 include a plurality of sub cell arrays for storing data, and are symmetrically positioned from the common data bus 20 in the up/down direction. Each of the cell array blocks 10 has a multi-bit line structure in which a plurality of sub bit lines are selectively connected to a main bit line. A sensing voltage of the main bit line is determined depending on the amount of current leaked from the main bitline by a sensing voltage of the sub bitline. The plurality of cell array blocks 10 share the common data bus 20.

In a read mode, the timing data register array unit 30 is connected to the cell array blocks 10 through the common data bus 20, for outputting data from the cell array blocks 10 to the data buffer bus 40. In a write mode, the timing data register array unit 30 transmits externally inputted data through the data buffer bus 40 to the cell array blocks 10 through the common data bus 20.

The timing data buffer unit 50 buffers data inputted from the I/O port(not show) and then transmits the data to the timing data register array unit 30. Also, the timing data buffer unit 50 buffers data from the timing data register array unit 30 and then outputs the data to the I/O port.

In the FeRAM, in a read operation, the data outputted from the cell array blocks 10 to the common data bus 20 are sensed and stored by the timing data register array unit 30.

The read data stored in the timing data register array unit 30 are outputted to the timing data buffer unit 50 through the data buffer bus 40.

On the other hand, in a write operation, the data inputted through the timing data buffer unit 50 are stored in the timing data register array unit 30 through the data buffer bus 40. The data stored in the timing data register array unit 30 are transmitted to the cell array blocks 10 through the common data bus 20, and written therein.

Figure 3:
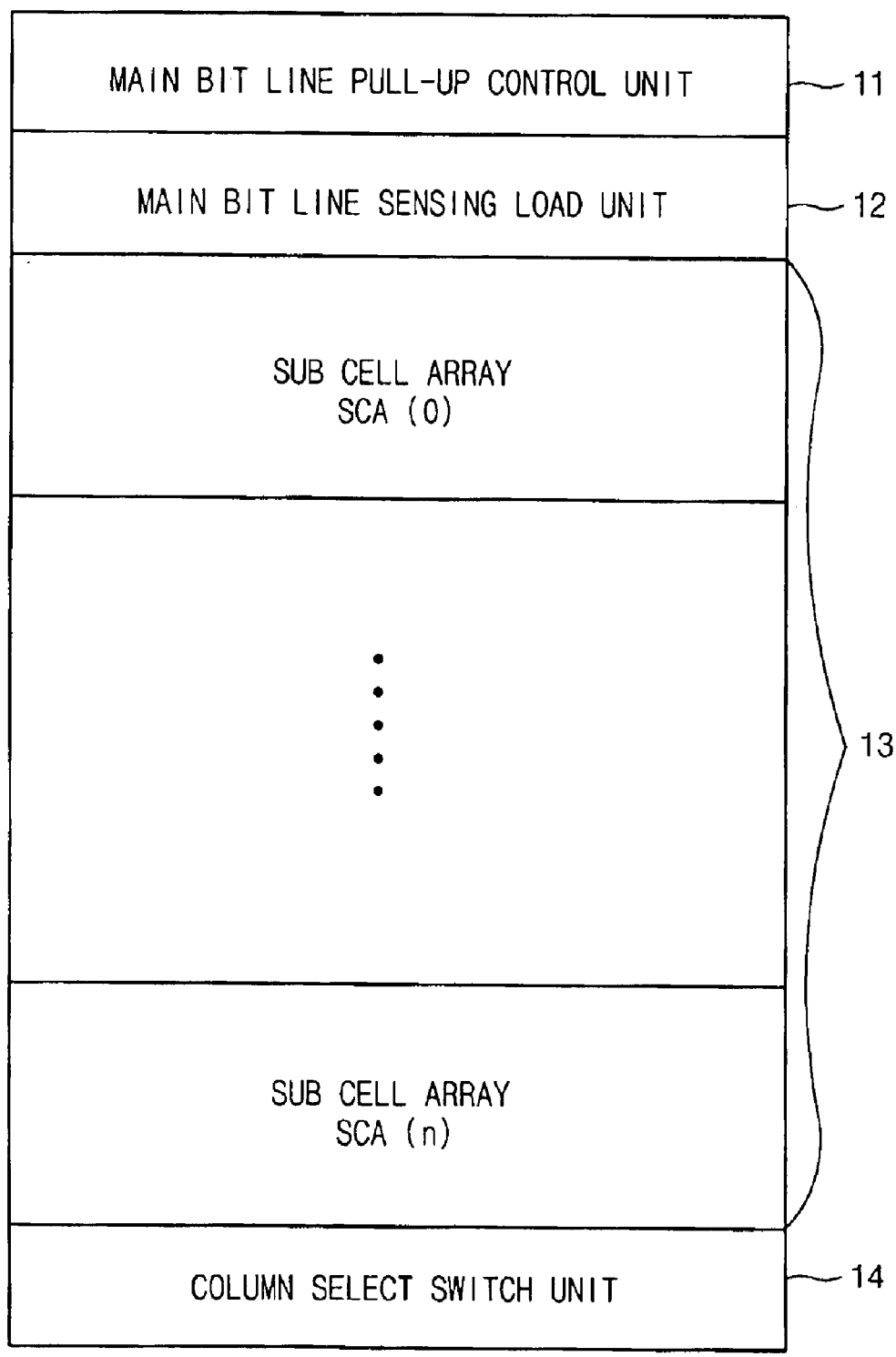
FIG. 3 is a detailed structure diagram illustrating the cell array block in accordance with the present invention.

FIG. 3 is a detailed structure diagram illustrating the cell array block 10 in accordance with the present invention.

The cell array block 10 includes a main bit line pull-up control unit 11, a main bit line sensing load unit 12, a plurality of sub cell arrays 13 and a column select switch unit 14. The main bit line corresponding to the plurality of sub cell arrays 13 is selectively connected to the common data bus 20 through the column select switch unit 14.

Figure 4:
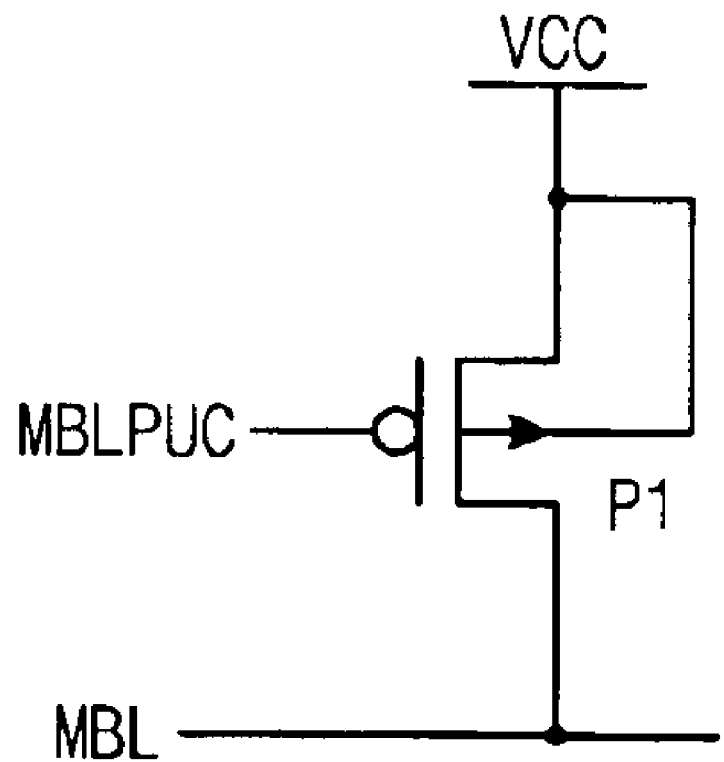
FIG. 4 is a detailed circuit diagram illustrating a main bit line pull-up control unit of FIG. 3.

FIG. 4 is a detailed circuit diagram illustrating the main bit line pull-up control unit 11 of FIG. 3.

The main bit line pull-up control unit 11 includes a PMOS transistor P1 for pulling up the main bit line MBL in response to a main bit line pull-up control signal MBLPUC in a precharge mode.

Here, the PMOS transistor P1 has its source terminal connected to a power voltage terminal VCC (or VPP) and its drain terminal connected to the main bit line MBL. Accordingly, the PMOS transistor P1 supplies power voltage VCC (or VPP) to the main bit line MBL in response to the main bit line pull-up control signal MBLPUC transmitted to its gate terminal.

Figure 5:
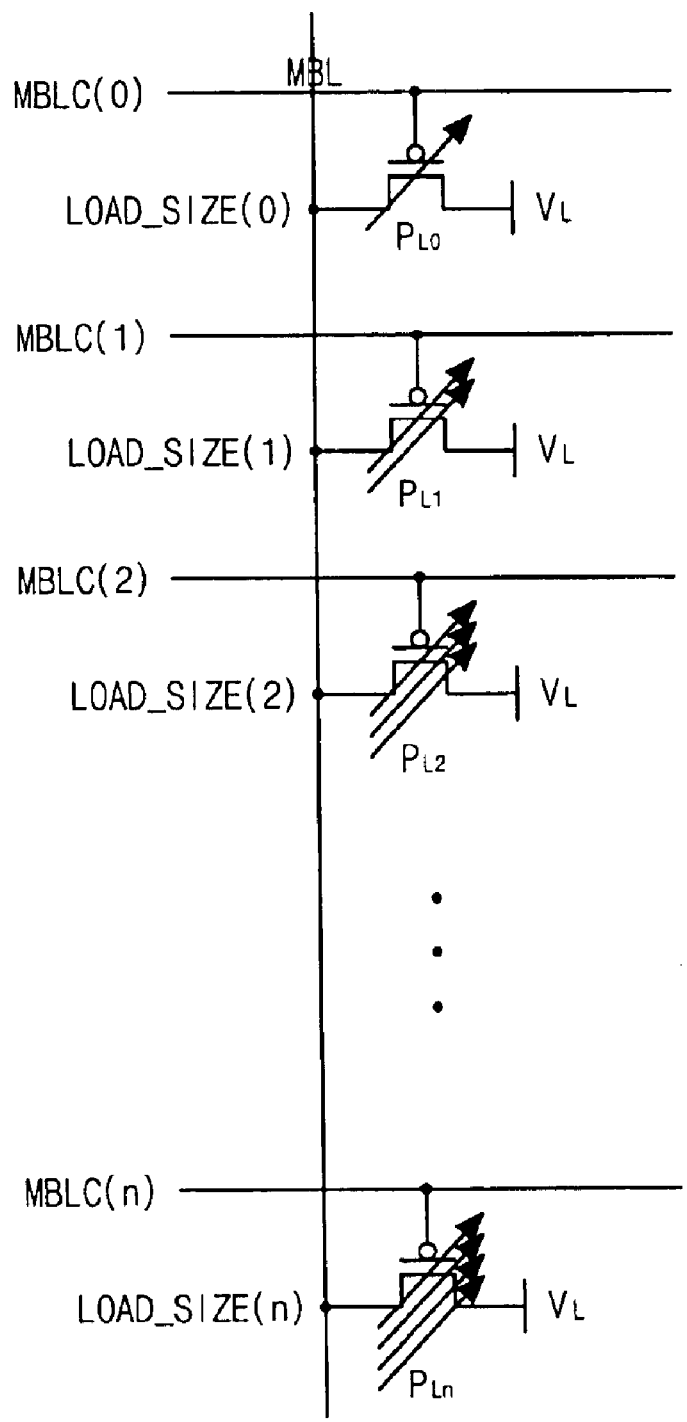
FIG. 5 is a detailed circuit diagram illustrating a main bit line sensing load unit of FIG. 3.

FIG. 5 is a detailed circuit diagram illustrating the main bit line sensing load unit 12 of FIG. 3.

The main bit line sensing load unit 12 controls sensing loads of the main bit line MBL. In accordance with the present invention, the main bit line sensing load unit 12 includes a plurality of PMOS transistors $P_{L0} \sim P_{Ln}$ corresponding to sub cell arrays SCA(0)~SCA(n) one by one and applying a different size of sensing loads to main bit line MBL. The PMOS transistors $P_{L0} \sim P_{Ln}$ have different channel resistance values for compensating for data property differences of the sub cell arrays SCA(0)~SCA(n), respectively.

That is, in the same cell array block 10, distances between the sub cell arrays SCA(0)~SCA(n) and the common data bus 20 are different, and thus the delay times when sensing voltages induced by each sub cell array SCA(0)~SCA(n) are transmitted to the common data bus 20 become different. In addition, in the whole cell array blocks 10, distances between the cell array blocks 10 and the timing data register array unit 30 are different, and thus the delay times when sensing voltages outputted to the common data bus 20 are transmitted to the timing data register array unit 30 become different.

Accordingly, in order to compensate for different delay time according to the positions of the sub cell arrays 13, the main bit line sensing load unit 12 selects the PMOS transistors having the channel resistance values corresponding to the positions of each sub cell array 13, and applys a different size of sensing loads to the main bit line MBL.

Here, a different size of the sensing loads applied to the main bit line MBL are shown as LOAD_SIZE(0)~LOAD_SIZE(n) in FIG. 5.

The PMOS transistors $P_{L0} \sim P_{Ln}$ have their source terminals connected to load voltage $V_L$ and their drain terminals connected to the main bit line MBL. In addition, the PMOS transistors $P_{L0} \sim P_{Ln}$ have their gate terminals connected to receive main bit line load control signals MBLC(0)~MBLC(n), respectively.

That is, the PMOS transistors $P_{L0}$~$P_{Ln}$ have different channel resistances, and apply a different size of sensing loads to the main bit line MBL in response to the main bit line load control signals MBLC(0)~MBLC(n). Here, the size of the channel resistances of each PMOS transistor $P_{L0}$~$P_{Ln}$ is determined according to the positions of the sub cell arrays SCA(0)~SCA(n) to equalize data properties of the whole cell array block 10.

Figure 6:
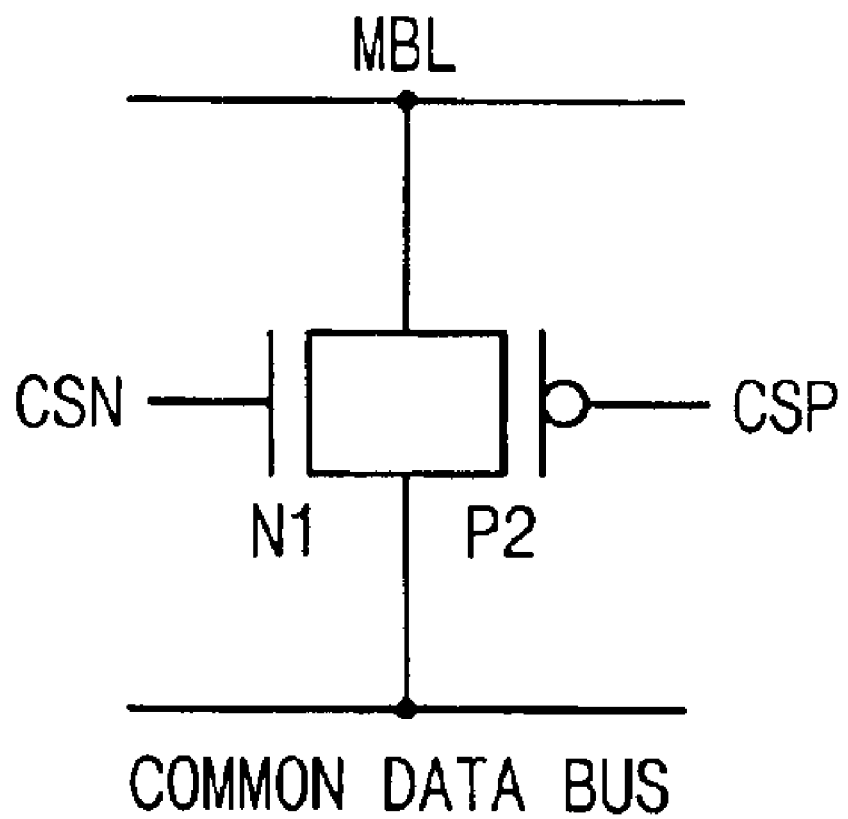
FIG. 6 is a detailed circuit diagram illustrating a column select switch unit of FIG. 3.

FIG. 6 is a detailed circuit diagram illustrating the column select switch unit 14 of FIG. 3.

The column select switch unit 14 selectively connects the main bit line MBL to the common data bus 20 in response to column select signals CSN and CSP. The column select switch unit 14 is connected in parallel between the main bit line MBL and the common data bus 20, and includes an NMOS transistor N1 and a PMOS transistor P2 having their gate terminals connected to receive the column select signals CSN and CSP, respectively.

Figure 7:
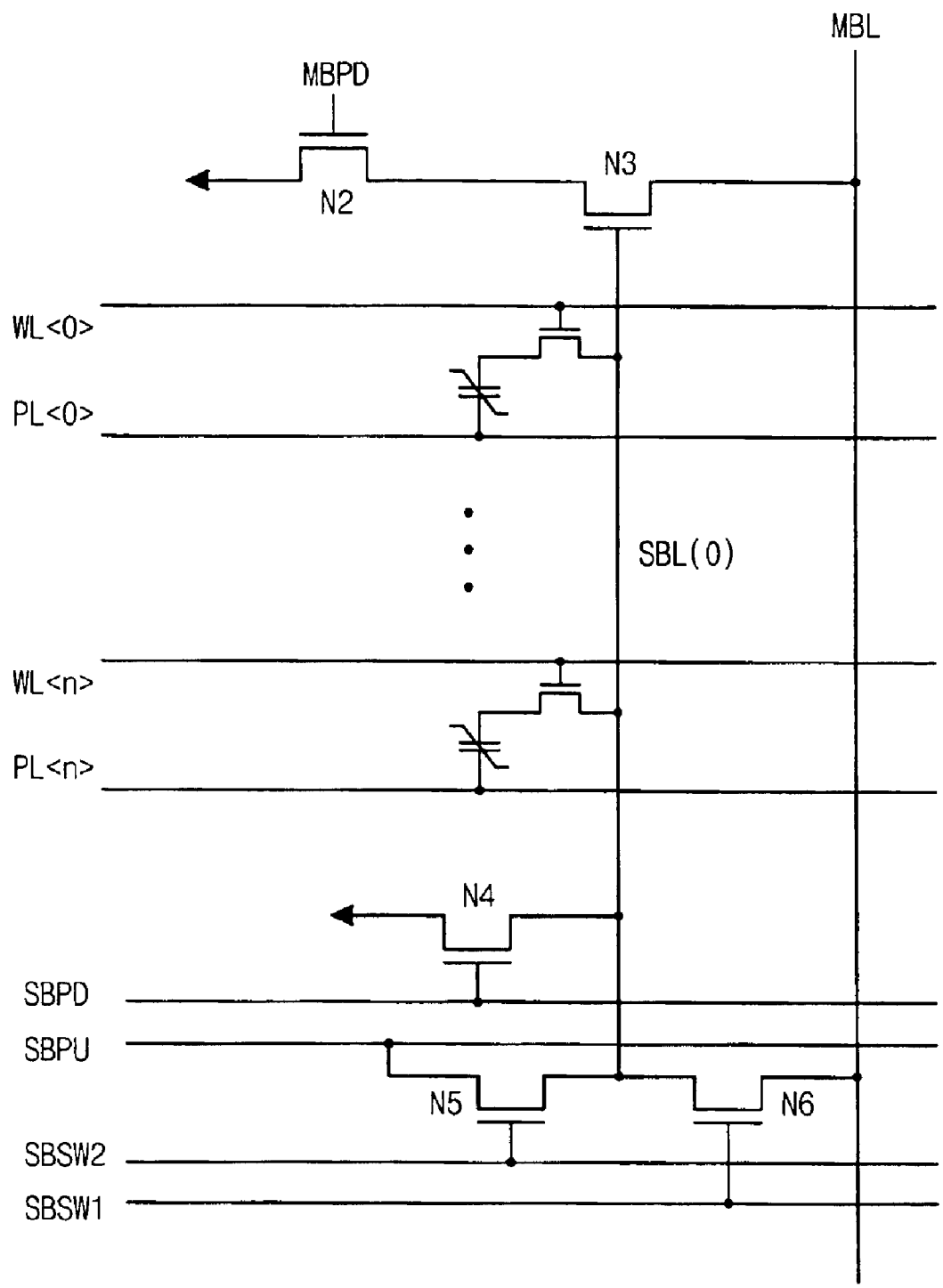
FIG. 7 is a detailed circuit diagram illustrating one unit sub cell array of sub cell arrays of FIG. 3.

FIG. 7 is a detailed circuit diagram illustrating one unit sub cell array SCA(0) of the sub cell arrays SCA(0)~SCA(n) of FIG. 3. The sub cell arrays SCA(0)~SCA(n) comprise sub bitlines SBL(0)~SBL(n), respectively, the main bit line MBL is shared the sub cell arrays SCA(0)~SCA(n). In the sub cell array SCA(0) of FIG. 7, the main bit line MBL is selectively connected to the sub bit line SBL(0).

Here, when one of a plurality of sub bit line select signals SBSW1 is activated, a corresponding NMOS transistor N6 is turned on. Therefore, load of the main bit line MBL is reduced to load of one sub bit line. In addition, a sub bit line pull-down signal SBPD is activated to turn on an NMOS transistor N4, and thus the sub bit line SBL(0) is adjusted to a ground voltage level.

A sub bit line pull-up signal SBPU controls power supplied to the sub bit line SBL(0), and a sub bit line select signal SBSW2 controls the sub bit line pull-up signal SBPU supplied to the sub bit line SBL(0).

For example, when a high voltage is intended to be generated in a low voltage, a higher voltage than power voltage VCC is supplied as the sub bit line pull-up signal SBPU. When the sub bit line select signal SBSW2 is activated, an NMOS transistor N5 is turned on, to supply a high voltage to the sub bit line SBL(0).

A plurality of cells are connected to each sub bit line SBL(0).

An NMOS transistor N2 is connected between a ground voltage terminal and an NMOS transistor N3, and has its gate terminal connected to receive a main bit line pull-down signal MBPD. The NMOS transistor N3 is connected between the NMOS transistor N2 and the main bit line MBL, and a gate terminal of the NMOS transistor N3 is connected to the sub bit line SBL(0). When the main bit line pull-down signal MBPD is activated and the NMOS transistor N3 is turned on by the sensing voltage of the sub bit line SBL(0), the sensing voltage of the main bit line MBL is induced.

For example, when the cell data is high, the voltage of the sub bit line SBL(0) increases, and more current flows through the NMOS transistor N3, to remarkably reduce a voltage level of the main bit line MBL. Conversely, when the cell data is low, the voltage of the sub bit line SBL(0) decreases, and less current flows through the NMOS transistor N3, to slightly reduce the voltage level of the main bit line MBL. That is, voltage level differences are generated in the main bit line MBL in response to the cell data, and the cell data are obtained by using the differences.

Figure 8:
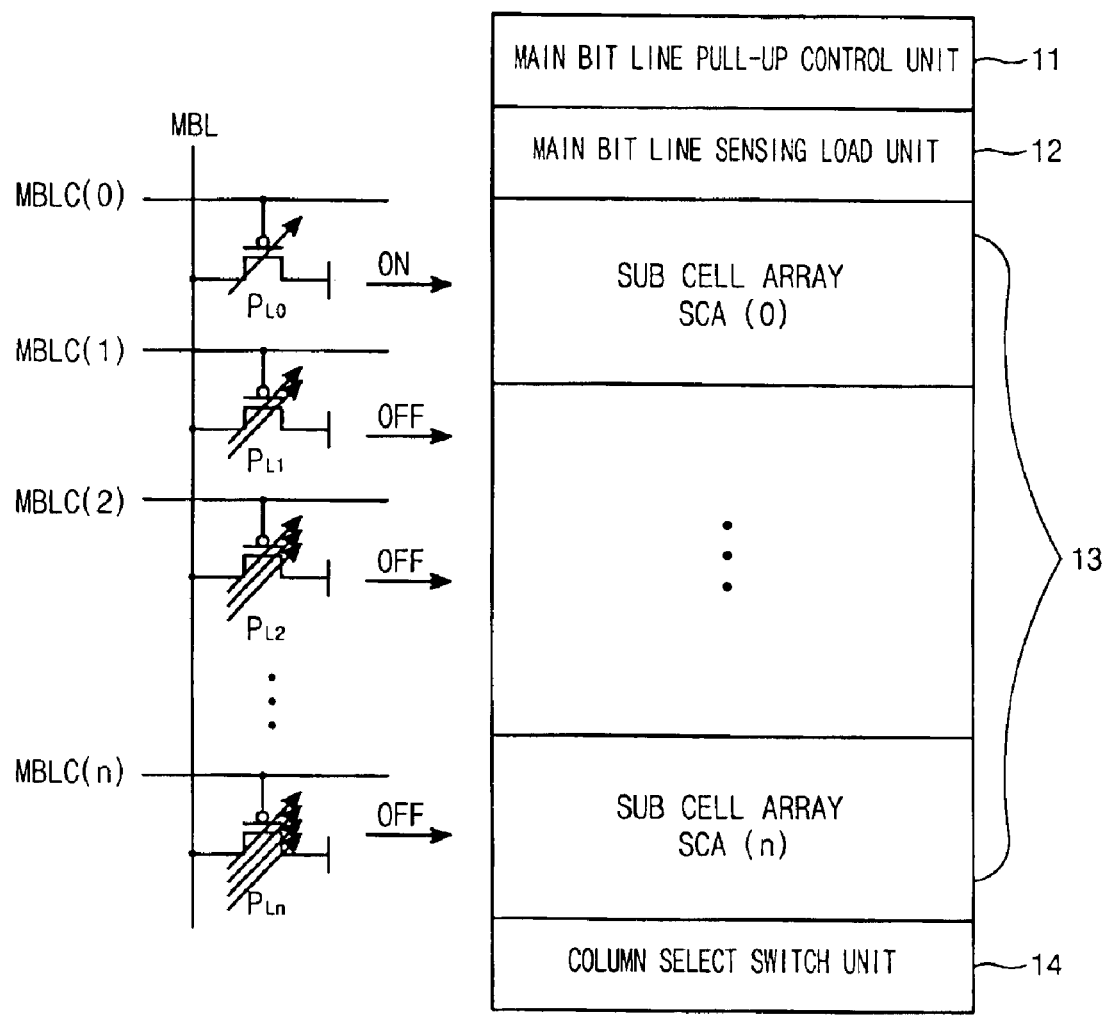
FIGS. 8 and 9 are diagrams provided to explain an operation of the cell array block in accordance with a first embodiment of the present invention.
Figure 9:
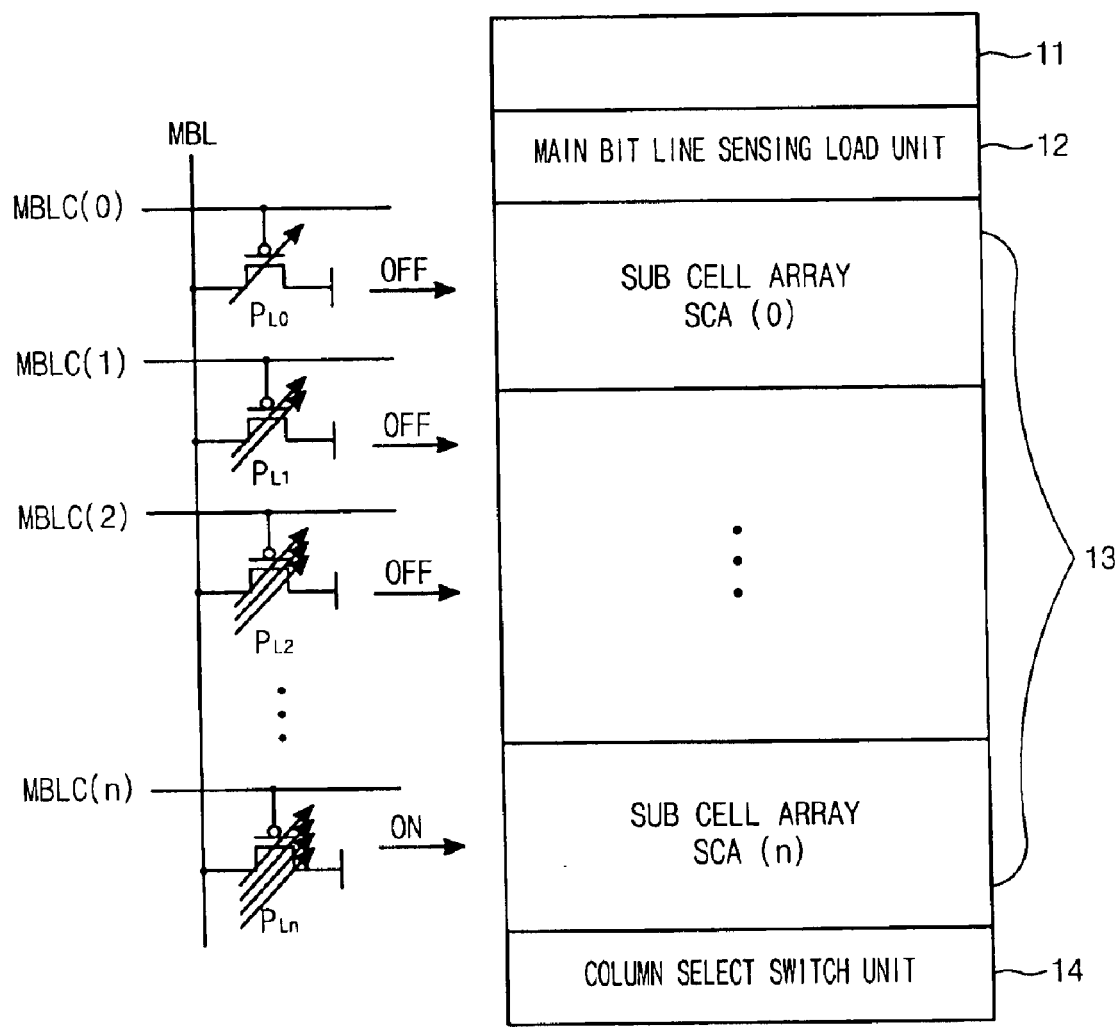

FIGS. 8 and 9 are diagrams provided to explain an operation of the cell array blocks 10 in accordance with a first embodiment of the present invention.

The main bit line sensing load unit 12 includes the plurality of PMOS transistors $P_{L0}$~$P_{Ln}$ selectively turned on/off in response to the main bit line control signals MBLC(0)~MBLC(n), for adjusting the size of the sensing loads of the main bit line MBL. Each PMOS transistor $P_{L0}$~$P_{Ln}$ corresponds to the sub cell arrays SCA(0)~SCA(n) one by one, when the sub cell array SCA(0) is operated, as shown in FIG. 8, the main bit line control signal MBLC(0) is activated to a low level, and the other main bit line control signals MBLC(1)—MBLC(n) are deactivated to a high level. Accordingly, the sensing load LOAD_SIZE(0) is applied to the main bit line MBL.

When the sub cell array SCA(n) is operated, as shown in FIG. 9, the main bit line control signal MBLC(n) is activated to a low level, and the other main bit line control signals MBLC(0)—MBLC(n-1) are deactivated to a high level. Thus, the sensing load LOAD_SIZE(n) is applied to the main bit line MBL.

As described above, a different size of sensing loads are applied to the main bit line MBL according to the positions of the sub cell arrays SCA(0)—SCA(n) in the multi-bit line structure of FIG. 7, thereby equalizing the data properties of the sub cell arrays SCA(0)~SCA(n).

Figure 10:
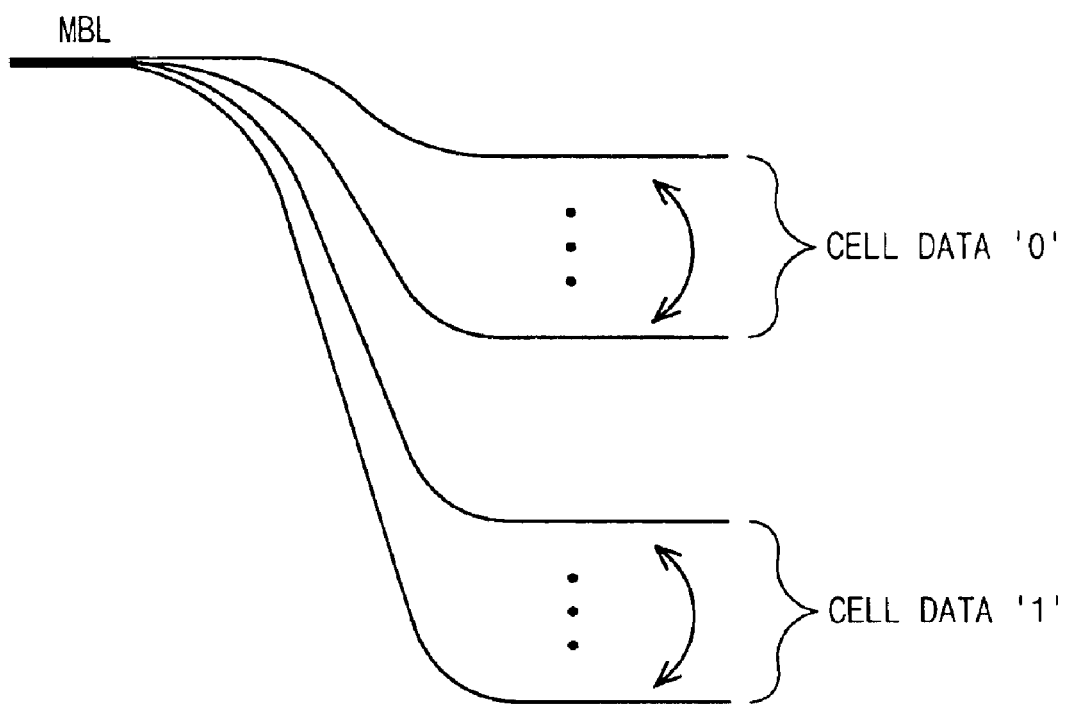
FIG. 10 is a diagram illustrating operation properties of a main bit line according to main bit line sensing load control of FIGS. 8 and 9.

FIG. 10 is a diagram illustrating application ranges of the sensing loads applied to the main bit line MBL of FIGS. 8 and 9 for the cell data '0'and '1'.

As illustrated in FIG. 10, the sensing load levels of the sub cell arrays SCA(0)~SCA(n) can be set in the ranges corresponding to the cell data '0' and '1'.

In accordance with the present invention, one of the sensing levels of the main bit line MBL is set as a reference level, and the channel resistances of the PMOS transistors $P_{L0}$~$P_{Ln}$ are controlled to allow the other sensing levels to reach the reference level, respectively.

A different size of sensing loads LOAD_SIZE(0) ~LOAD_SIZE(n) are applied to the main bit line MBL by using the channel resistances of the PMOS transistors $P_{L0}$~$P_{Ln}$, so that the whole sub cell arrays SCA(0)~SCA(n) of the cell array block 10 can have the same cell data properties regardless of their positions.

Figure 11:
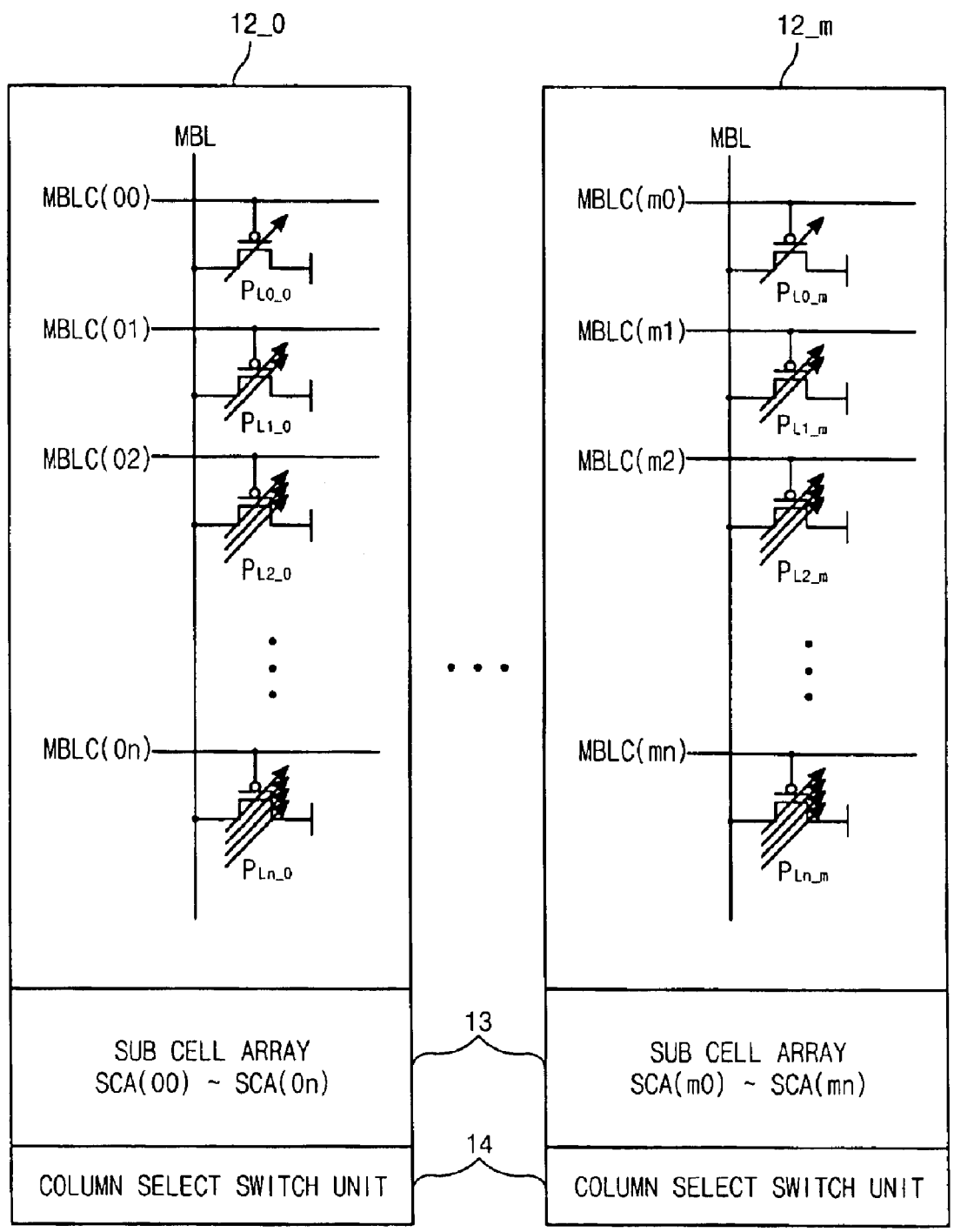
FIG. 11 is a detailed structure diagram illustrating the main bit line sensing load units for the plurality of cell array blocks.

FIG. 11 is a detailed structure diagram illustrating the main bit line sensing load units 12 for the plurality of cell array blocks 10.

In the above embodiment, a different size of sensing loads LOAD_SIZE(0)~LOAD_SIZE(n) have been applied to the main bit line MBL according to the positions of the sub cell arrays SCA(0)~SCA(n) from the common data bus 20 in one cell array block 10. However, when the plurality of cell array blocks 10 are arranged as shown in FIG. 11, distances between the cell array blocks 10 and the timing data register array unit 30 are different. It is thus preferable to compensate for resulting delays.

Accordingly, when the channel resistances of the PMOS transistors $P_{L0\_0}$~$P_{Ln\_0}$ and $P_{L0\_m}$~$P_{Ln\_m}$ of each main bit line sensing load unit 12_0~12_m are decided, not only distances between the sub cell arrays SCA(00)~SCA(mn) and the common data bus 20 but also distances between the sub cell arrays SCA(00)~SCA(mn) and the timing data register array unit 30 are considered.

The main bit line sensing load units 12_0~12_m are operated in the same manner as FIGS. 8 and 9, and the method for deciding the size of loads is performed in the same manner as FIG. 10.

Figure 12:
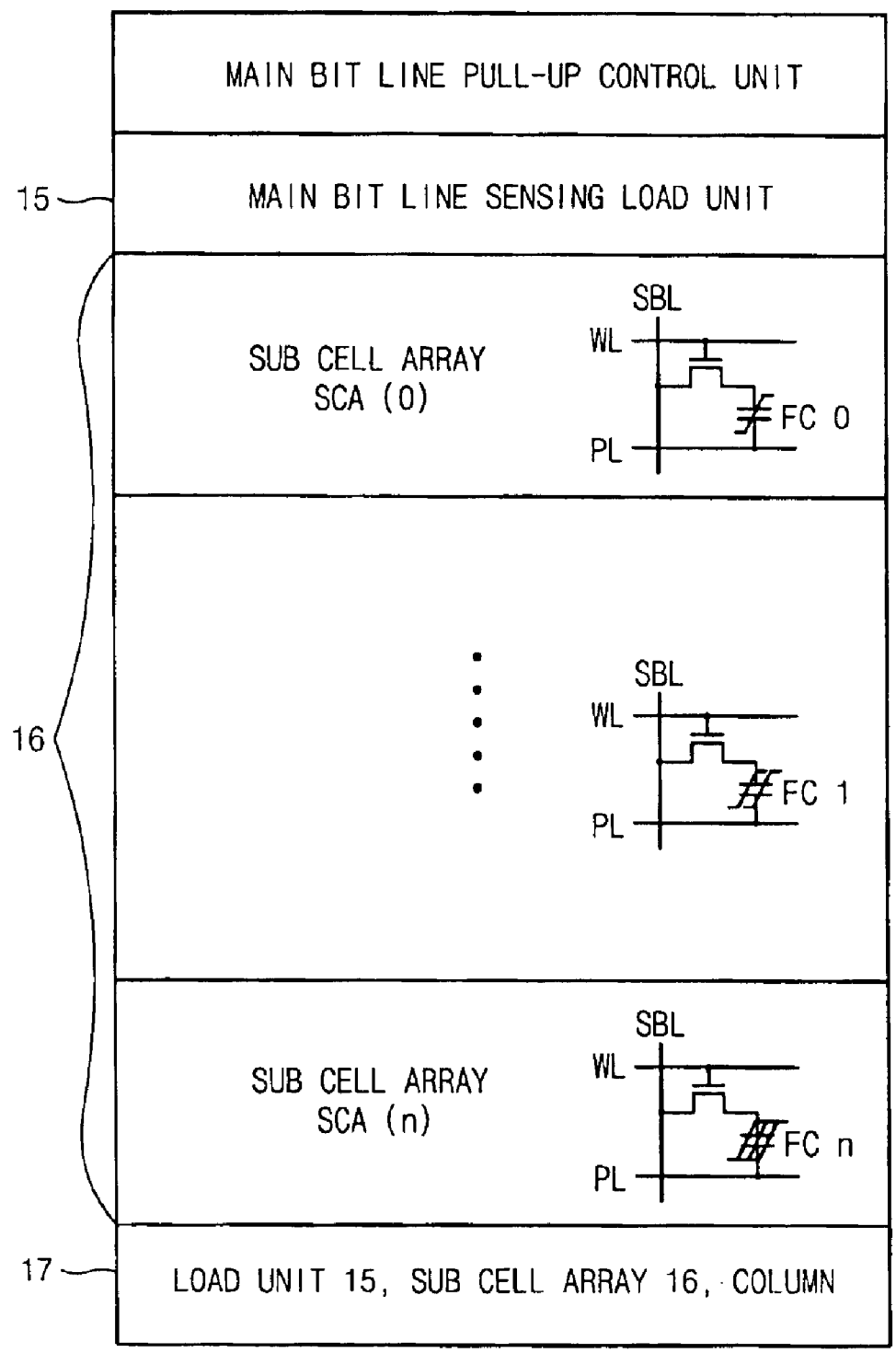
FIG. 12 is a diagram provided to explain an operation of a cell array block in accordance with a second embodiment of the present invention.

FIG. 12 is a diagram provided to explain an operation of a cell array block 10 in accordance with a second embodiment of the present invention.

Figure 13:
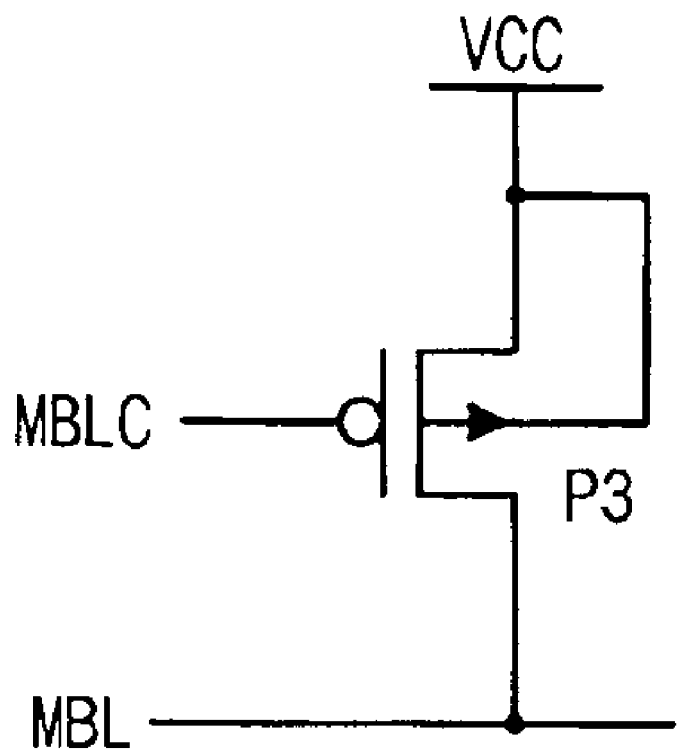
FIG. 13 is a detailed circuit diagram illustrating a main bit line sensing load unit of the cell array block in accordance with the second embodiment of the present invention.

Differently from the first embodiment, a main bit line sensing load unit 15 includes one PMOS transistor P3 (FIG. 13) as in the general multi-bit line structure. However, capacitances of ferroelectric capacitors FC0~FCn composing a cell are differentially set according to positions of sub cell arrays SCA(0)—SCA(n).

A sensing level of a main bit line MBL is changed according to the size of the ferroelectric capacitors FC0~FCn composing the cell. Although the size of sensing loads of the main bit line MBL is fixed, if the size of the ferroelectric capacitors FC0~FCn is changed according to the positions of the sub cell arrays SCA(0)~SCA(n), data property differences can be compensated as in the first embodiment.

For this, the size of the capacitors FC0~FCn of the sub cell arrays SCA(0)~SCA(n) is gradually reduced near the common data bus 20 as shown in FIG. 12.

In the embodiment of FIG. 12, the main bit line sensing load unit 15 can be formed in the same manner as FIG. 5.

Figure 14:
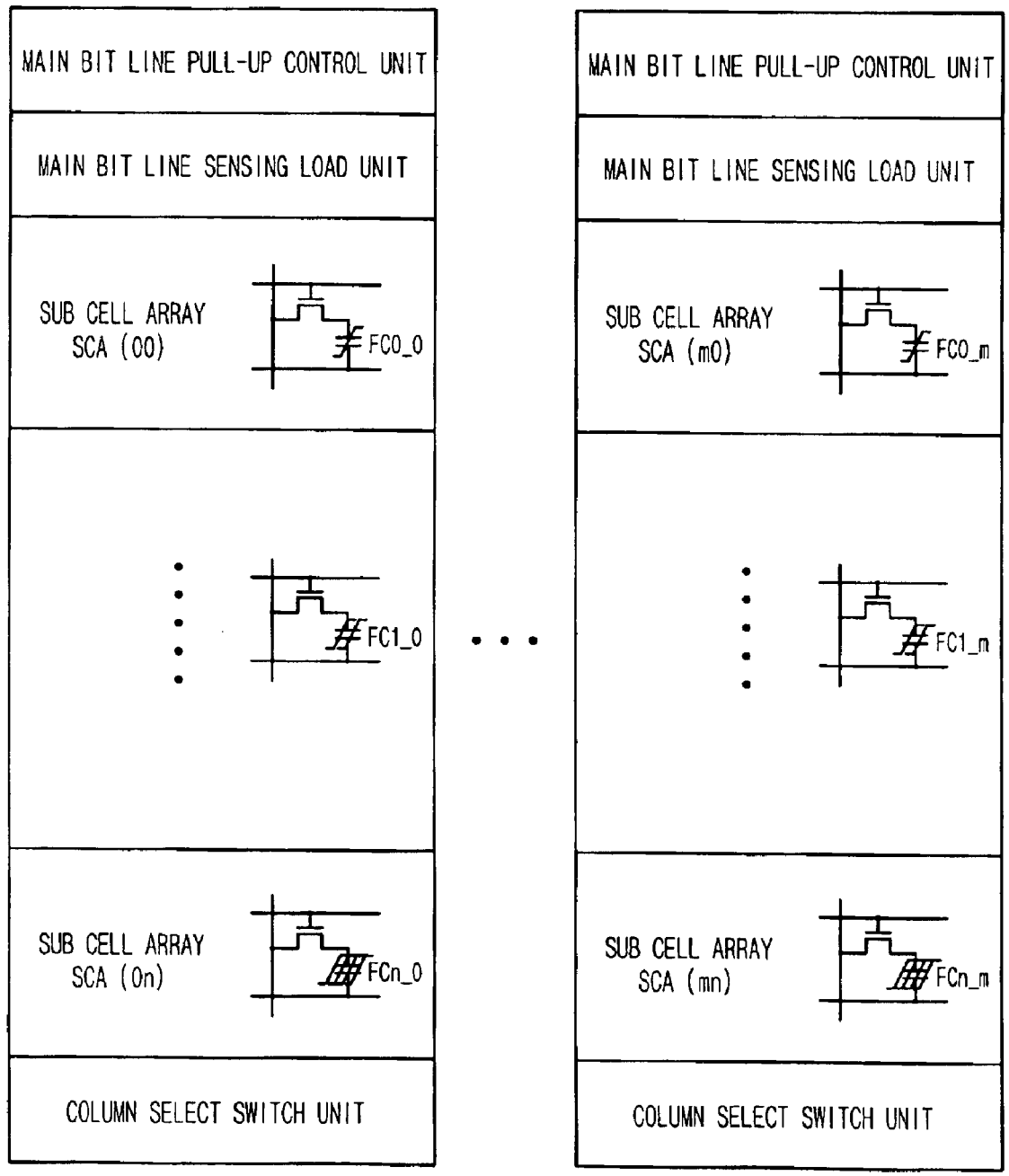
FIG. 14 is a structure diagram illustrating a size of capacitors of sub cell arrays of the plurality of cell array blocks.

FIG. 14 is a structure diagram illustrating the size of the capacitors of the sub cell arrays SCA(00)~SCA(mn) of the plurality of cell array blocks 10.

When the plurality of cell array blocks 10 are arranged as shown in FIG. 14, delays of the sensing voltages are changed due to different distances between the cell array blocks 10 and the timing data register array unit 30 according to the positions of the cell array blocks 10. Such differences must be compensated for. Therefore, the size of the capacitors FCO_0~FCn_0 and FCO_m~FCn_m of each sub cell array SCA(00)~SCA(mn) must be decided in consideration of distances between the sub cell arrays SCA(00)~SCA(mn) and the common data bus 20 and distances between the sub cell arrays SCA(00)~SCA(mn) and the timing data register array unit 30.

Figure 15:
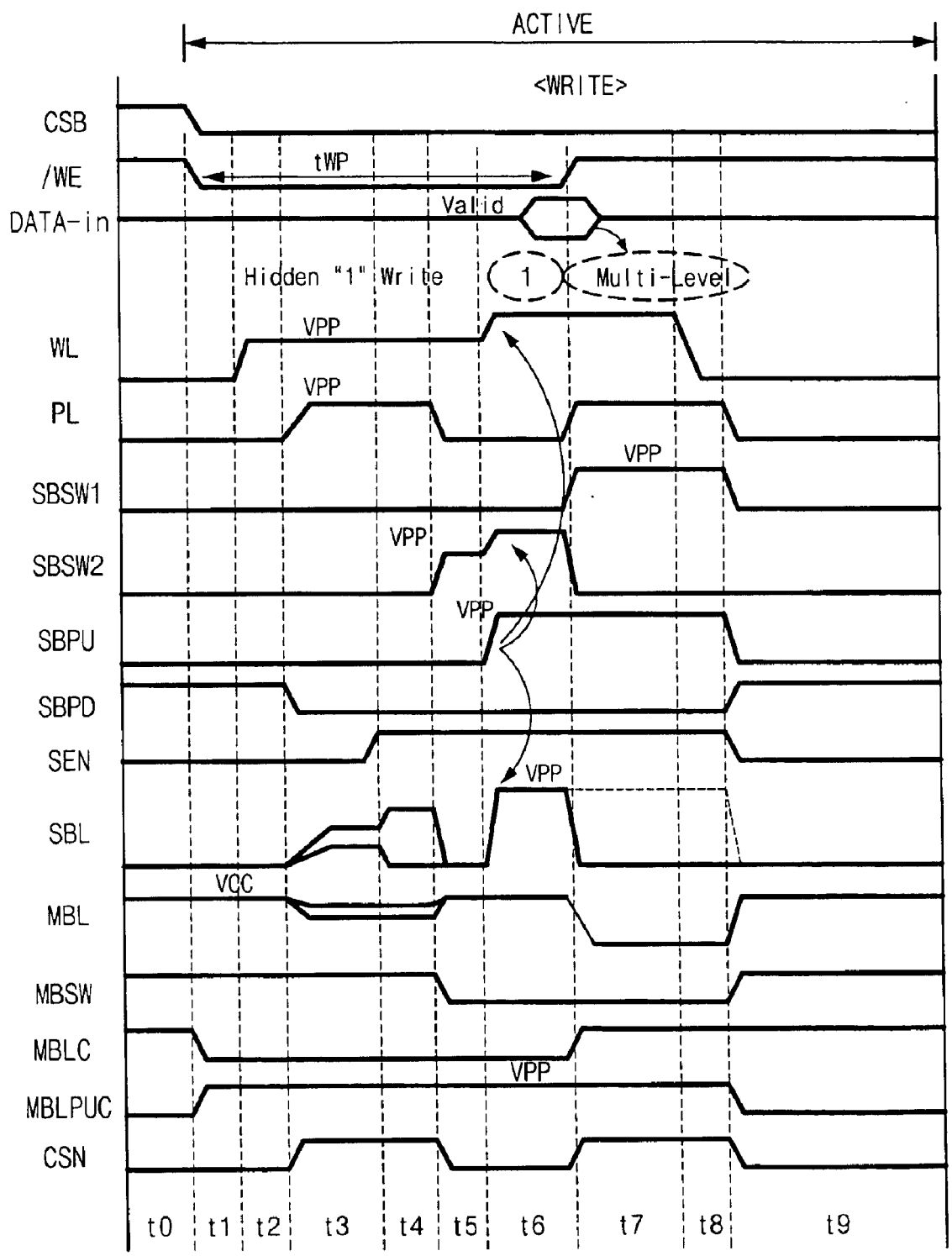
FIG. 15 is a timing diagram provided to explain a write operation of the FeRAM in accordance with the present invention.

FIG. 15 is a timing diagram provided to explain the write operation of the FeRAM in accordance with the present invention.

In t1 period, when a chip select signal CSB and a write enable signal /WE are disabled to a low level, a write mode is active. The sub bit line pull-down signal SBPD and the main bit line load control signal MBLC are disabled to a low level, and the main bit line pull-up control signal MBLPUC is enabled to a high level. Here, in the first embodiment described above, one of the main bit line load control signals MBLC(O)~MBLC(n) is activated to a low level according to the positions of the sub cell arrays.

The main bit line MBL is pulled up in response to the main bit line pull-up control signal MBLPUC before activation of a word line WL and a plate line PL.

In t2 period, the word line WL is activated, and the sub bit line pull-down signal SBPD is continuously deactivated, to initialize a storage node of the cell to a ground level. After the initialization, the sub bit line pull-down signal SBPD is deactivated to a low level, and the plate line PL is activated to a high level. Here, the word line WL is activated earlier than the plate line PL to stabilize the state of the storage node of the cell during the initialization to improve a sensing margin.

Thereafter, in entrance of t3 period, when the plate line PL is enabled to a pumping voltage VPP level, the voltage level of the sub bit line SBL increases. In addition, the column select signal CSN is enabled to connect the main bit line MBL to the common data bus 20.

In t4 period which is a data sensing period, a sense amp enable signal SEN is enabled to transmit the cell data to the main bit line MBL.

In t5 period, the plate line PL is disabled to a low level, and the sub bit line select signal SBSW2 is enabled to a high level. The sub bit line SBL and the column select signal CSN are disabled to a low level.

In t6 period, a hidden data '1' is recorded. In addition, the voltage of the word line WL is increased, the sub bit line pull-up signal SBPU is enabled to the pumping voltage VPP level, and thus the sub bit line select signal SBSW2 is enabled to the pumping voltage VPP level. Accordingly, the voltage level of the sub bit line SBL is increased to the pumping voltage VPP level.

In t5 and t6 periods where the column select signal CSN has a low level, the main bit line MBL is pulled up to the power voltage VCC in response to the main bit line control signal MBLC regardless of the data transmitted to the common data bus 20.

In t7 period, multi-level data can be recorded in response to the write enable signal /WE. In entrance of t7 period, the plate line PL is re-enabled to a high level. The sub bit line select signal SBSW1 is increased to the pumping voltage VPP level, and the sub bit line select signal SBSW2 is disabled. Here, the main bit line control signal MBLC and the column select signal CSN are enabled to a high level.

Therefore, in the period where the sub bit line select signal SBSW1 has the pumping voltage VPP level, the data applied to the sub bit line SBL and the main bit line MBL are recorded on the memory cell.

In t9 period, the word line WL, the plate line PL, the sub bit line select signal SBSW1 and the sub bit line pull-up signal SBPU are disabled. The sub bit line pull-down signal SBPD is enabled, and the sense amp enable signal SEN is disabled. The main bit line pull-up control signal MBLPUC is disabled to precharge the main bit line MBL to the power voltage VCC level. At this time, the column select signal CSN is disabled to intercept connection between the main bit line MBL and the common data bus 20.

Figure 16:
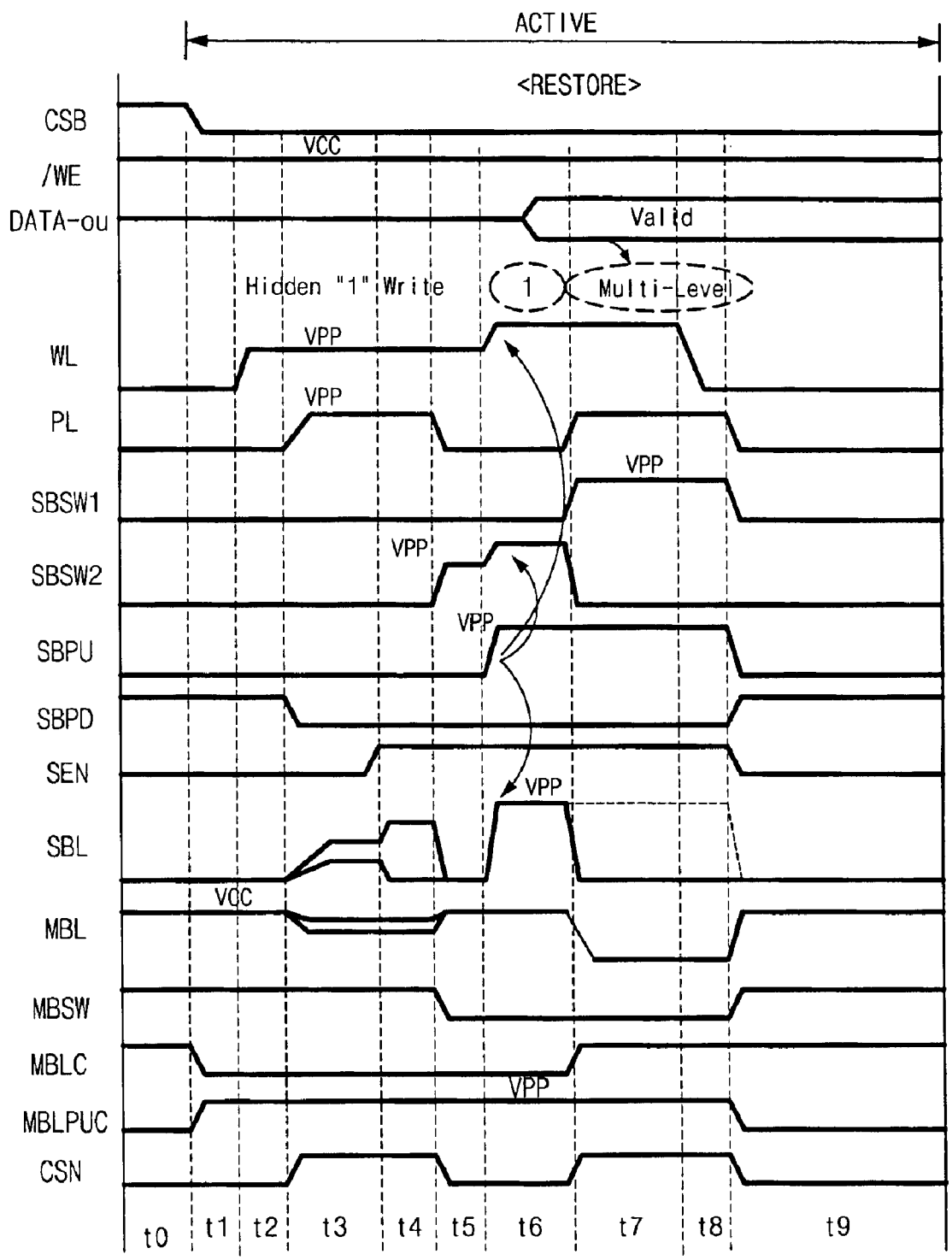
FIG. 16 is a timing diagram in a read mode of the FeRAM in accordance with the present invention.

FIG. 16 is a timing diagram in a read mode of the FeRAM in accordance with the present invention.

In the read mode, the write enable signal /WE is maintained in the power voltage VCC level. t3 and t4 periods are data sensing periods. The hidden data '1' is recorded in t6 period, and a data output valid period is maintained after t6 period.

Here, the cell array blocks 10 do not record the data externally inputted through the common data bus 20 on the cell, but restore the read data stored in the timing data register array unit 30 in the cell.

The data are restored in t7 period. That is, data are transmitted to the sub bit line SBL and the main bit line MBK by a feedback decoder loop in the period where the sub bit line select signal SBSW1 has a high level. Thus, the data are restored in the memory cell.

In t7 and t8 periods, the data levels stored in the cell array blocks 10 are sensed and outputted through the common data bus 20.

In accordance with another embodiment of the present invention, a memory device can be manufactured by using the first and second embodiments. That is, main bit line sensing load units 12 of cell array blocks 10 include a plurality of PMOS transistors $P_{L0}$~$P_{Ln}$ for applying a different size of sensing loads to a main bit line MBL, respectively, and sub cell arrays SCA(00)~SCA(mn) include a different size of ferroelectric capacitors according to their positions.

In FIG. 5, the plurality of PMOS transistors $P_{L0}$~$P_{Ln}$ are formed to correspond to the sub cell arrays SCA(0)~SCA(n) one by one. However, the sensing loads of the main bit line can be controlled by logic combinations of a predetermined number of PMOS transistors having different channel resistance values.

As discussed earlier, in accordance with the present invention, the FeRAM transmits a different size of sensing loads to the main bit line according to the positions of each sub cell array in the multi-bit line structure cell array block, thereby equalizing the cell data properties of the whole cell array block. Moreover, the FeRAM differentially sets the size of the ferroelectric capacitors composing the memory cell according to the positions of each sub cell array, thereby equalizing the cell data properties of the whole cell array block.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A cell array block of a ferroelectric random access memory, comprising:
   a cell array unit including a plurality of sub cell arrays wherein a sensing voltage of a main bitline is induced depending on the amount of current leaked from the main bitline by a sensing voltage of a sub bitline;
   a main bit line pull-up control unit for pulling up the main bit line in response to a main bit line pull-up control signal in a precharge mode;
   a main bit line sensing load unit for controlling a sensing load of the main bit line in consideration of a position of the sub cell array in response to a main bit line load control signal; and
   a column select switch unit for selectively outputting the sensing voltage of the main bit line to a common data bus in response to a column select signal.

2. The cell array block of claim 1, wherein the main bit line sensing load unit comprises a plurality of switching devices selectively turned on/off in response to the main bit line load control signal, for varying the sensing load of the main bit line.

3. The cell array block of claim 2, wherein the plurality of switching devices have different channel resistance.

4. A cell array block of a ferroelectric random access memory, comprising:
   a cell array unit including a plurality of sub cell arrays wherein a sensing voltage of a main bitline is induced depending on the amount of current leaked from the main bitline by a sensing voltage of a sub bitline according to a data value of a memory cell having ferroelectric capacitors;
   a main bit line pull-up control unit for pulling up the main bit line in response to a main bit line pull-up control signal in a precharge mode;
   a main bit line sensing load unit for applying a sensing load to the main bit line in response to a main bit line load control signal; and
   a column select switch unit for selectively outputting the sensing voltage of the main bit line to a common data bus in response to a column select signal,
   wherein the ferroelectric capacitors have different capacitances according to positions of the plurality of sub cell arrays.

5. A cell array block of a ferroelectric random access memory, comprising:
   a cell array unit including a plurality of sub cell arrays wherein a sensing voltage of a main bitline is induced depending on the amount of current leaked from the main bitline by a sensing voltage of a sub bitline according to a data value of a memory cell having ferroelectric capacitors;
   a main bit line pull-up control unit for pulling up the main bit line in response to a main bit line pull-up control signal in a precharge mode;
   a main bit line sensing load unit for controlling a sensing load of the main bit line in consideration of a position of the sub cell array in response to a main bit line load control signal; and
   a column select switch unit for selectively outputting the sensing voltage of the main bit line to a common data bus in response to a column select signal,
   wherein the ferroelectric capacitors have different capacitances according to the positions of the plurality of sub cell arrays.

6. The cell array block of claim 5, wherein the main bit line sensing load unit comprises a plurality of switching devices selectively turned on/off in response to the main bit line load control signal, for varying the sensing load of the main bit line.

7. The cell array block of claim 6, wherein the plurality of switching devices have different channel resistance values.

8. A ferroelectric random access memory, comprising:
   a plurality of cell array blocks including a plurality of sub cell arrays wherein a sensing voltage of a main bitline is induced depending on the amount of current leaked from the main bitline by a sensing voltage of a sub bitline;
   a common data bus shared by the plurality of cell array blocks, for transmitting read data and write data for the cell array blocks; and
   a timing data register array unit connected to the common data bus, for sensing the read data and outputting the write data to the common data bus,
   wherein a sensing load of the main bit line is variably controlled according to a position of the operated sub cell array.

9. The ferroelectric random access memory of claim 8, wherein the plurality of cell array blocks each respectively comprise:
   a cell array unit including the plurality of sub cell arrays;
   a main bit line pull-up control unit for pulling up the main bit line in response to a main bit line pull-up control signal in a precharge mode;
   a main bit line sensing load unit for control ling a sensing load of the main bit line in consideration of a position of the sub cell array in response to a main bit line load control signal; and
   a column select switch unit for selectively outputting the sensing voltage of the main bit line to a common data bus in response to a column select signal.

10. The ferroelectric random access memory of claim 9, wherein the main bit line sensing load unit variably controls the sensing load of the main bit line according to distances between the operated sub cell array and the timing data register array unit.

11. The ferroelectric random access memory of claim 10, wherein the main bit line sensing load unit comprises a plurality of switching devices selectively turned on/off in response to the main bit line load control signal, for varying the sensing load of the main bit line.

12. The ferroelectric random access memory of claim 11, wherein the plurality of switching devices have different channel resistance values.

13. A ferroelectric random access memory, comprising:
  a plurality of cell array blocks including a plurality of sub cell arrays wherein a sensing voltage of a main bitline is induced depending on the amount of current leaked from the main bitline by a sensing voltage of a sub bitline;
  a common data bus shared by the plurality of cell array blocks, for transmitting read data and write data for the cell array blocks; and
  a timing data register array unit connected to the common data bus, for sensing the read data and outputting the write data to the common data bus,
  wherein the plurality of sub cell arrays have different capacitances of ferroelectric capacitors in a memory cell for storing data according to their positions.

14. The ferroelectric random access memory of claim 13, wherein the plurality of sub cell arrays have different capacitances according to distances from the timing data register array unit.

15. A ferroelectric random access memory, comprising:
  a plurality of cell array blocks including a plurality of sub cell arrays wherein a sensing voltage of a main bitline is induced depending on the amount of current leaked from the main bitline by a sensing voltage of a sub bitline;
  a common data bus shared by the plurality of cell array blocks, for transmitting read data and write data for the cell array blocks; and
  a timing data register array unit connected to the common data bus, for sensing the read data and outputting the write data to the common data bus,
  wherein a sensing load of the main bit line is variably controlled and the plurality of cell array blocks have different capacitances of ferroelectric capacitors according to positions of the plurality of sub cell arrays.

16. The ferroelectric random access memory of claim 15, wherein the plurality of cell array blocks each respectively comprise:
  a cell array unit including the plurality of sub cell arrays having different capacitances in a memory cell according to their positions;
  a main bit line pull-up control unit for pulling up the main bit line in response to a main bit line pull-up control signal in a precharge mode;
  a main bit line sensing load unit for controlling a sensing load of the main bit line in consideration of the position of the sub cell array in response to a main bit line load control signal; and
  a column select switch unit for selectively outputting the sensing voltage of the main bit line to the common data bus in response to a column select signal.

17. The ferroelectric random access memory of claim 16, wherein the main bit line sensing load unit comprises a plurality of switching devices selectively turned on/off in response to the main bit line load control signal, for varying the sensing load of the main bit line.

18. The ferroelectric random access memory of claim 17, wherein the plurality of switching devices have different channel resistance values.

* * * * *